United States Patent
McElvain

(10) Patent No.: US 6,735,743 B1
(45) Date of Patent: May 11, 2004

(54) METHOD AND APPARATUS FOR INVALID STATE DETECTION

(75) Inventor: Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 296 days.

(21) Appl. No.: 09/828,394

(22) Filed: Apr. 5, 2001

Related U.S. Application Data

(63) Continuation of application No. 09/458,545, filed on Dec. 9, 1999, now Pat. No. 6,389,586, which is a continuation-in-part of application No. 09/002,894, filed on Jan. 5, 1998, now Pat. No. 6,182,268.

(51) Int. Cl.$^7$ .......................... G06F 17/50; G06F 11/00; G01R 31/28

(52) U.S. Cl. ............... 716/4; 714/738; 716/2

(58) Field of Search ........... 716/4, 2; 714/738

(56) References Cited

U.S. PATENT DOCUMENTS

| | | | |
|---|---|---|---|
| 5,394,347 A | 2/1995 | Kita et al. ................ | 364/578 |
| 5,461,573 A | * 10/1995 | Chakradhar et al. ........ | 716/4 |
| 5,493,505 A | 2/1996 | Banerjee et al. ........... | 364/488 |
| 5,517,432 A | 5/1996 | Chandra et al. ......... | 364/578.1 |
| 5,526,486 A | 6/1996 | Moloney et al. ....... | 395/185.02 |
| 5,537,580 A | 7/1996 | Giomi et al. ............. | 395/500 |
| 5,583,786 A | 12/1996 | Needham ................ | 364/488 |
| 5,706,473 A | 1/1998 | Yu et al. .................. | 395/500 |
| 5,774,370 A | 6/1998 | Giomi ..................... | 364/489 |
| 5,784,298 A | * 7/1998 | Hershey et al. ............. | 714/39 |
| 5,894,420 A | 4/1999 | Duncan .................... | 364/489 |
| 5,910,958 A | 6/1999 | Jay et al. ................. | 371/27.1 |
| 6,009,531 A | 12/1999 | Selvidge et al. .......... | 713/400 |
| 6,028,988 A | 2/2000 | Asaka ..................... | 395/500.5 |
| 6,334,200 B1 | * 12/2001 | Fujiwara et al. ............ | 714/738 |

OTHER PUBLICATIONS

H–C Liang et al., Invalid State Identification for Sequential Circuit Test Generation, Proceedings of the 5$^{th}$ Asian Test Symposium, pp. 10–15, Nov. 1996.*

H–C Liang et al., Identifying Invalid States for Sequential Circuit Test Generation, IEEE Transactions on Computer–Aided Desig of Integrated Circuits and Systems, vol. 16, No. 9, pp. 1025–1033, Sep. 1997.*

W. Grieskamp et al., Generating Finite State Machines from Abstract State Machines, Proceedings of the International Symposium on Software Testing and Analysis, pp. 112–122, May 2002.*

T.N. Mudge, et al., Class: A CAD System for Automatic Synthesis and Verification of Asynchronous Finite State Machines, Proceedings of the 26$^{th}$ Internation Conference on System Scciences, pp. 389–398.

P. Ashar et al., Verification of RTL Generated From Scheduled Behavior in a High–Level Synthesis Flow, IEEE/ACM Conference on Computer–Aided Design, pp. 517–524.

(List continued on next page.)

Primary Examiner—A. M. Thompson
(74) Attorney, Agent, or Firm—Blakely, Sokoloff, Taylor & Zafman LLP

(57) ABSTRACT

A method is described that comprises determining a state machine design point from a plurality of state machine design point options. At least one of the plurality of state machine design point options corresponds to a safe design point. The method then further comprises, if the safe design point is the determined state machine design point, forming a safe state machine model. The safe state machine model has valid state logic separated from invalid state logic. Another method is described that comprises detecting an invalid state of a state machine with invalid state logic and setting a state machine register to a valid state with the invalid state logic. The method then further comprises continuing valid state operation of the state machine with valid state logic. The valid state logic is separated from the invalid state logic.

84 Claims, 11 Drawing Sheets

OTHER PUBLICATIONS

A. El–Maleh, A Fast Sequential Learning Technique For Real Circuits With Application to Enhancing ATPG Performance, Proceedings Design Automation Conference, pp. 625–631.

K. T. Cheng, Initializability Consideration In Sequential Machine Synthesis, IEEE Transactions on Computers, pp. 374–379.

H–C. Liang, et al., Identifying Invalid States for Sequential Circuit Test Gerneration, IEEE Transactions on Computer–Aided Design of Integrated Circuits and Systems, pp. 1025–1033.

H–C. Liang, et al., Invalid State Identification For Sequential Circuit Test Generation, Proceedings of the Fifth Asian Test Symposium, pp. 10–15.

O. Garnica et al., Finite State Machine Optimization Using Genetic Algorithms, Second Internation Conference on Genetic Algorithms in Engineering Systems, pp. 283–289.

J.J. Kim et al., Finite State Machine Optimization Algorithms for Pipelined Data Controllers, Fourth Annual IEEE International ASIC Conference and Exhibit, p18–7/1–4.

C.L. Berman et al., Functional Comparison of Logic Designs for VLSI Circuits, IEEE International Conference on Computer–Aided Design, pp. 456–459.

F. Vahid, Modifying Min–Cut for Hardware and Software Functional Partitioning, Proceedings of Fifth International Workshop on Hardware/Software Codesign, pp. 43–48.

S. Devadas, Boolean Minimization and Algebraic Factorization Procedures for Fully Testable Sequential Machines, 1989 IEEE International Conference on Computer Aided Design, pp. 208–211.

* cited by examiner

METHOD AND APPARATUS FOR INVALID STATE DETECTION

This application is a continuing application of, and hereby claims the benefit of, U.S. patent application Ser. No. 09/458,545 filed on Dec. 9, 1999 now U. S. Pat. No. 6,389,586 B1 and which is a continuation-in-part of, and to which the present application further claims the benefit of, U.S. patent application Ser. No. 09/002,894 filed on Jan. 5, 1998 now U.S. Pat. No. 6,182,268 B1.

FIELD OF THE INVENTION

The present invention relates generally to the field of circuit design synthesis, and more particularly to the design of integrated circuits which include state machine circuits.

BACKGROUND OF THE INVENTION

Automatic State Machine Extraction

For the design of digital circuits on the scale of VLSI (Very Large Scale Integration) technology, designers often employ computer-aided techniques. Standard languages known as Hardware Description Languages (HDL's) have been developed to describe digital circuits to aid in the design and simulation of complex digital circuits. Several hardware description languages, such as VHDL and Verilog, have evolved as industry standards. VHDL and Verilog are general purpose hardware description languages which allow definition of a hardware model at the gate level, the register transfer level (RTL), or the behavioral level using abstract data types. As device technology continues to advance, various product design tools have been developed to adapt HDLs for use with newer devices and design styles.

One important aspect in the field of circuit synthesis and simulation is in the modeling and analysis of finite state machines. A state machine is a generalized type of sequential logic in which the next state of the machine (or circuit) can be written as a function of the current state and the value of the input signals to the machine. Because state machines can be used to represent digital circuits which combine combinational logic and a memory element, state machines are a fundamental building block in the synthesis of large scale digital circuits. The modeling of state machines is especially important given the prevalent use of programmable logic devices to implement sequential logic functions within a circuit. It is desirable to identify a state machine within a logic design because well known optimizations can be performed on the state machine. Further, a state machine may be debugged by using conventional debugging methods. However, designers who use HDL to create circuit designs often do not intentionally include a state machine in a circuit design. That is, a designer may merely write HDL code specifying the circuit design without intending to include a state machine and without realizing that, in fact, a state machine has been unintentionally included in the circuit design. Thus, the optimnization and debugging of state machines is not possible when a state machine is included in this manner because the state machine's existence in the design is unrecognized and its definition in a symbolic form (e.g. definition by a next state function or by a state diagram or state table) is not provided by the designer or as a result of a compiler's logic synthesis.

Present methods and products associated with HDL synthesis accommodate the analysis of finite state machines (FSM). These methods, however, require the users to either constrain the style in which the finite state machine is described by following a rigid coding template, or to isolate the finite state machine from other parts of the design and identify the HDL variable representing the current state of the finite state machine. In the first case the restriction allows the finite state machine to be recognized with pattern matching on the original HDL source code. In the second, the state machine is extracted from a netlist with Boolean logic techniques, relying on the user's identification of both the state register and the portion of the design that is to be considered part of the state machine.

The identification of the part of the design and design information that is involved in the state machine is important. Not including enough of the design will lead to an extracted state machine that contains many states that are not reachable (invalid) in the whole design as well as state to state transitions that cannot be activated within the context of the whole design. These invalid states and transitions will both create a larger optimization problem as well as biasing the finite state machine optimization towards getting a good result for states and transitions which are not needed. Including too much of the design yields an analysis problem that can be computationally difficult or impractical, as well as disturbing the optimization of parts of the design that did not need to be included.

One deficiency in these techniques is that only circuits that the user thinks of as state machines and that the user makes the effort to identify are treated as state machines.

A second deficiency is that theses techniques place strong constraints on the way the user can describe state machines, either by requiring a rigid coding template to be followed or by requiring he design to be organized to isolate the state machine (for example, using design hierarchy) from other parts of the design.

Recovery From an Invalid State

Invalid states are those states that are not used during normal state machine operation. For example, assume a three bit state machine is utilized to implement a function having six states. Since the use of three bits corresponds to eight possible states, there are two invalid states for the six state function implemented with a three bit state machine.

In regard to the handling of invalid states, different applications may require different treatment of a state machine's invalid states. The transition to an invalid state is typically caused by hardware related phenomena (such as an alpha particle hit or a thermal noise spike) that causes one or more bits to undesirably "flip" within the state register(s) of a state machine. A bit flip within a state machine state register represents a state change of that state machine.

Since the specific bit(s) that may flip are typically random, a state machine can undesirably jump to an invalid state as a result of these phenomena. Selecting the proper design point of a state machine's ability to handle invalid states involves a tradeoff between the area/time consumed in implementing/executing the state machine design within a semiconductor device.

On one end of the spectrum exist those state machine designs devoid of logic directed to handling a transition to an invalid state. These designs are significantly exposed to a bit flip to an invalid state. If a bit flip to an invalid state occurs and a state machine is without logic devoted to handling the invalid state, the state machine will be "stuck" in an invalid state rendering the state machine inoperable.

Designs that are completely exposed to a transition to an invalid state, however, have minimal semiconductor device surface area consumption and propagation delay. The absence of logic devoted to the recovery of the state machine from an invalid state results in fewer gates (and/or look-up tables) and simpler signal paths within the semiconductor device. Thus, by selecting a design point having no invalid state recovery, one simultaneously selects a high performance design point from the perspective of area and time efficiency. Such a design choice is proper, for example, for applications directed to high speed, low cost, and low bit flip occurrence probability environments.

On the other end of the spectrum are those design points that select thorough invalid state recovery and poor area/time consumption. State machines having such a design point may have complicated invalid state recovery algorithms. For example, requiring some invalid states to trigger to one valid state (e.g., state "S5"), while requiring other invalid states to trigger to another valid state (e.g., state, "S4").

The logic needed to implement complicated invalid state recovery schemes (as described just above) tend to undesirably consume large amounts of semiconductor surface area as well as complicate the signal paths through the device. Approaches such as these are best left to applications directed to lower speed, higher cost, and high bit flip occurrence probability environments.

Many environments do not fit squarely into either of those mentioned above. Thus, many applications are best served by not selecting either of the two choices above. Many designers would therefore prefer a software design tool that not only provides automatic state machine extraction but also provides more of a "sliding scale" of design point options with respect to the tradeoff between a state machine's ability to recover from an invalid state and the consumption of device area/execution time.

SUMMARY OF THE INVENTION

A method is described comprising determining a state machine design point from a plurality of state machine design point options, where one of the plurality of state machine design point options corresponds to a safe design point. Then, forming a safe state machine model, if the safe design point is the determined state machine design point; where the safe state machine model has valid state logic separated from invalid state logic. Another method is described comprising detecting an invalid state of a state machine with invalid state logic. Then, setting a state machine register to a valid state with the invalid state logic. Then, continuing valid state operation of the state machine with valid state logic, where the valid state logic is separated from the invalid state logic.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A system for automatically extracting state machines from a complex digital circuit design and recovering from an invalid state is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form to facilitate explanation.

Hardware Overview

Figure 1A:
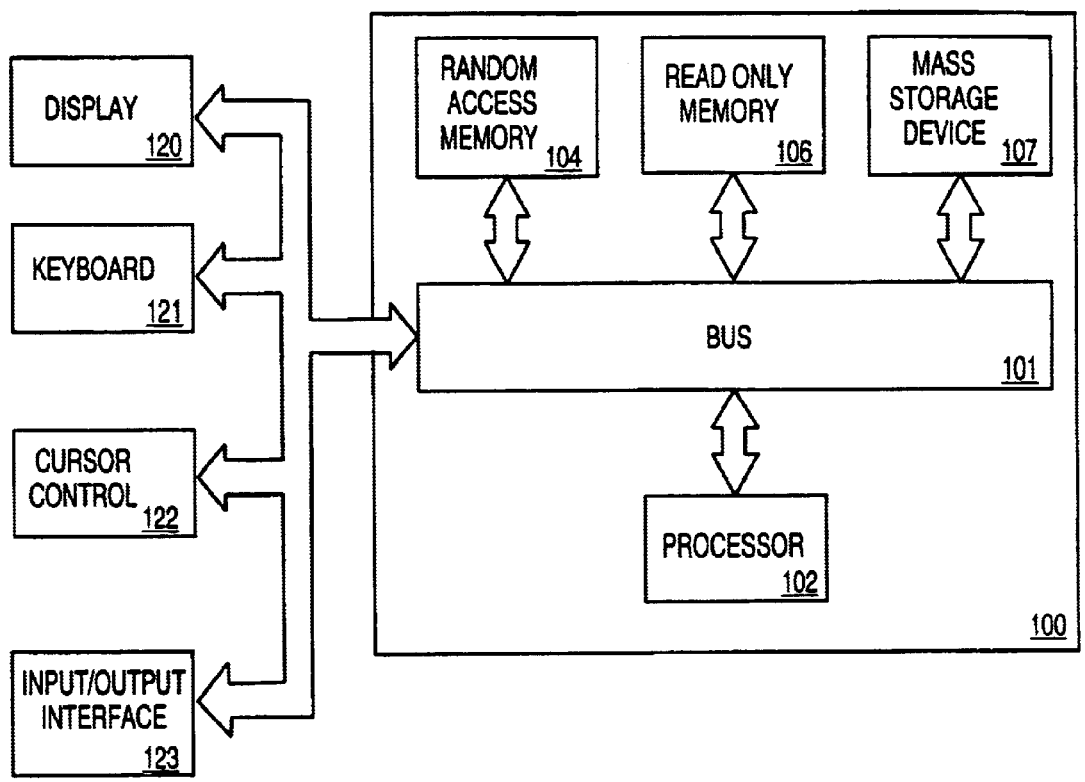
FIG. 1A is a block diagram of a computer system which may be used to implement an embodiment of the present invention.

FIG. 1A illustrates a block diagram of a computer system which may be used to implement an embodiment of the present invention. The computer system is used to perform logic synthesis of a design which is described in an HDL. The computer system 100 includes a processor 102 coupled through a bus 101 to a random access memory (RAM) 104, a read only memory (ROM) 106, and a mass storage device 107. Mass storage device 107 represents a persistent data storage device, such as a floppy disk drive, fixed disk drive (e.g., magnetic, optical, magneto-optical, or the like), or streaming tape drive. Processor 102 may be embodied in a general purpose processor (such as the Intel™ Pentium® processor), a special purpose processor, or a specifically programmed logic device.

Display device 120 is coupled to processor 102 through bus 101 and provides graphical output for computer system 100. Keyboard 121 and cursor control unit 122 are coupled to bus 101 for communicating information and command selections to processor 102. Also coupled to processor 102 through bus 101 is an input/output (I/O) interface 123 which can be used to control and transfer data to electronic devices (printers, other computers, etc.) connected to computer 100.

It should be noted that the architecture of FIG. 1 is provided only for purposes of illustration, and that a computer used in conjunction with the present invention is not limited to this specific architecture.

State Machine Extraction

A method of one embodiment of the present invention identifies and automatically extracts state machine circuits from a complex network of logic devices which have been created through a logic synthesis process from an HDL. In order to provide a context for a description of the present invention, an example of a logic synthesis process from HDL source code will be described. Then, a general example of a state machine will be provided before describing an example of a method of the present invention.

Figure 1B:
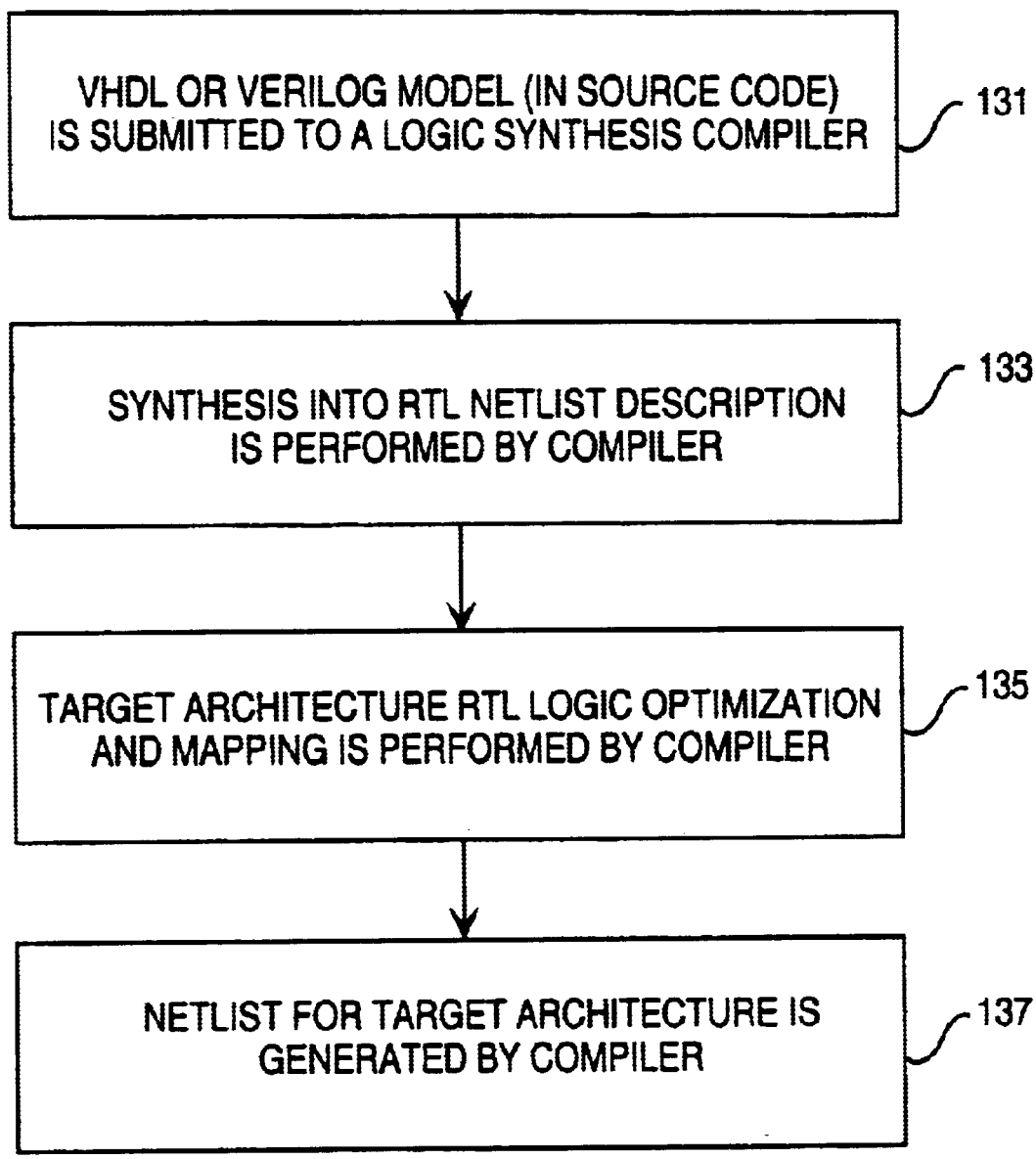
FIG. 1B is a flowchart which shows a synthesis process which may be used with the present invention.

FIG. 1B shows an example of an electronic design automation process which uses logic synthesis from an HDL description of a circuit to generate a detailed, gate level description which may be used to create the circuit in a semiconductor integrated circuit (IC). The following description assumes that the IC will be fabricated using a library of building blocks (e.g. lookup tables, multiplexers, I/O flip-flops, etc.) which is used by a particular target architecture. However, it will be appreciated that certain embodiments of the present invention may be used in design processes which are not confined to using a particular library with a confined set of building blocks. That is, the present invention may be used with circuit design which is technology independent. The process usually begins with the authoring of HDL source code which describes the circuit which is desired. The authoring process is well described in the literature. See, for example, Verilog HDL: A Guide to Digital Design and Synthesis, Samir Palnithar, SunSoft Press, 1996; also see, A VHDL Synthesis Primer, J. Bhasher, Star Galaxy Publishing, 1996. A completed version of the authored source code is, in step 131 of FIG. 1B, then submitted to a logic synthesis compiler. This logic synthesis compiler is typically a computer program which operates on a general purpose computer system, although in some embodiments the computer system may be a dedicated, special purpose computer system. An example of a logic synthesis compiler is the program "Synplify" from Synplicity, Inc. of Sunnyvale, Calif. The submitted HDL code is then compiled, in step 133, into a particular level of description which is often an RTL (register transfer level) netlist. The RTL netlist will usually show registers and other logic interconnected to show the flow of data through a circuit which was described in the HDL code. In other examples of logic synthesis, the compiler may produce a gate level description of the circuit. The logic synthesis compiler will next, in step 135, optimize and map the synthesized RTL netlist description from step 133 into a target architecture which is usually determined by a supplier of programmable IC's. An example of a target architecture is the programmed lookup tables (LUTs) and associated logic of the Xilinx XC4000 integrated circuit which is a field programmable gate array from Xilinx, Inc. of San Jose, Calif. Other examples of target architectures include those well known architectures in field programmable gate arrays and complex programmable logic devices from vendors such as Altera, Lucent Technologies, Advanced Micro Devices (AMD), and Lattice Semiconductor. The present invention may also be employed with ASICs (Application Specific Integrated Circuits). The mapping in step 135 converts the synthesized RTL level description of the desired circuit into the equivalent circuit implemented using building blocks of the target architecture. The optimization in step 135 optimizes the desired circuit, as implemented using those building blocks, by removing unnecessary logic, etc.

Typically, step 137 will generate a netlist which is designed to serve as an input to the target architecture's place and route software tools (which is usually provided by the vendor which specifies the target architecture); these tools use the netlist to automatically specify the inputs to the vendor's IC in order to program the IC to produce the desired circuit. In one embodiment, however, step 137 may generate a gate level netlist for a particular target architecture by performing the operations of the vendor's place and route software tools. It will also be appreciated that, if no particular target architecture is specified (e.g. the designed circuit is to be technology independent), then steps 135 and 137 will usually produce a circuit schematic and associated netlist which may be used to construct an IC. A general description of a state machine will now be provided.

Digital circuits designed for use in VLSI devices contain upwards of hundreds of thousands of transistors which make up various different circuits such as logic gates, counters, arithmetic units, and so on. State machines are fundamental building blocks or circuit elements within many digital circuits. State machines represent a general form of sequential logic in which the output state of the machine depends on the input values and on the previous state of the machine. Sequential logic thus requires some form of memory. This memory is typically implemented in the form of digital flip-flop circuits. Thus, a generalized state machine consists simply of logic circuits and a memory register.

Figure 2:
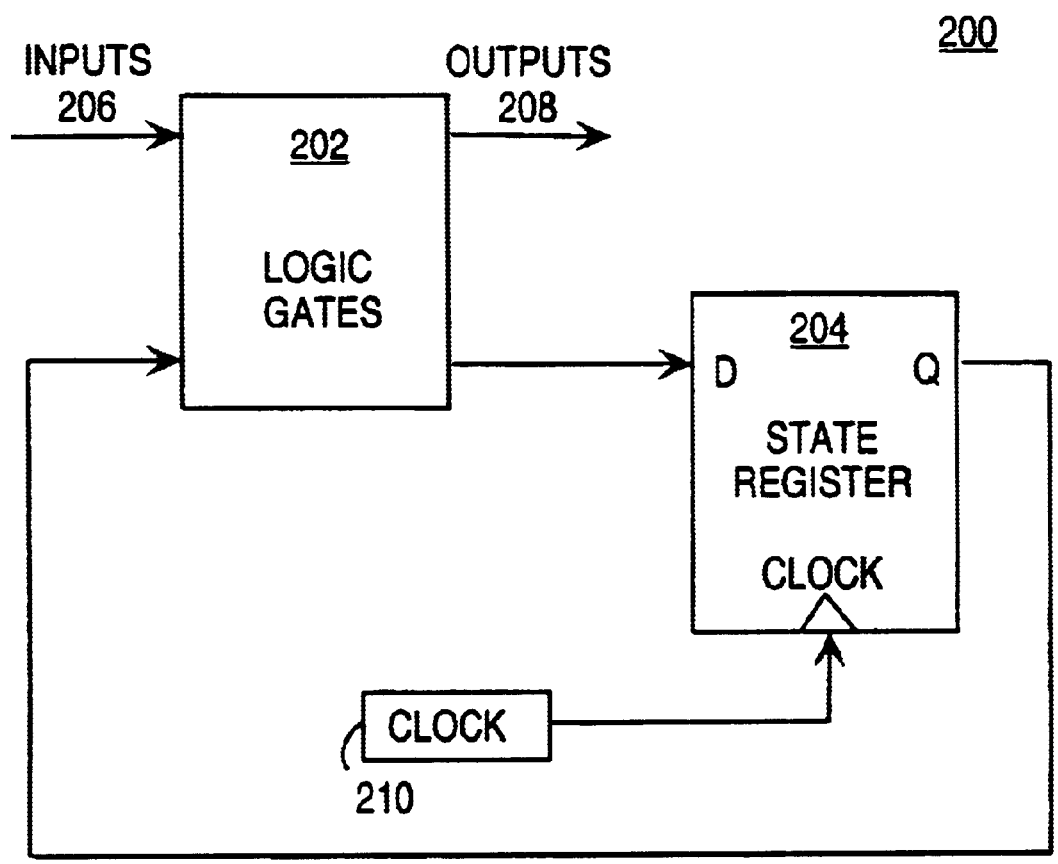
FIG. 2 is a block diagram representation of a generalized digital state machine.

FIG. 2 is a block diagram representation of a general digital state machine circuit 200. In many current VLSI devices, the state machine of FIG. 2 would be implemented in a programmable logic device such as a field programmable gate array (FPGA) device or a complex programmable logic device (CPLD) or a Programmable Array Logic (PAL) device. The state machine circuit 200 includes logic gates 202 and a D flip flop state register 204. Logic gate block 202 represents a combinational logic circuit which processes input signals 206 to produce output signals 208. Logic gate block 202 may represent any number and type of combinational logic circuits. An output signal from logic gate block 202 is input to the D input of state register 204. This output signal represents the state value or "state" of the state machine. The output signal from the Q output of state register 204 is fed back and input to logic gate block 202. A clock 210 provides the clock signal to the clock input of state register 204. Each clock pulse causes the signal level present at the D input of the state register to be transferred to the Q output. The clock signal is sometimes referred to as a state clock or state clock signal. It will be appreciated that this clock signal may be a true clock signal (e.g. a signal with high and low voltage levels which exist at periodic, timed intervals with a consistent duty cycle) or just a signal which specifies that the next state is to be latched into the state register 204 (e.g. what might be referred to as a pseudo clock). Thus the "clock" input of register 204 may be merely a load or load enable input. It should be noted that D flip-flop 204 may represent a single register which consists of any number (n) of individual flip-flops in order to provide storage for an n-bit state value. In this case the D input would represent inputs $D_1$ to $D_n$, and the Q output would represent outputs $Q_1$ to $Q_n$.

The state machine of circuit 200 thus operates such that the logic gates receive both the Q output from state register 204 as well as the input signals 206 applied to the circuit. The logic gates 202 then generate a new set of D inputs to state register 204 as well as a new set of logic outputs 208. The output state of state machine 200 can therefore be represented as a function of the current state (from the Q output of register 204) and input signals. This relationship can be represented functionally by the equation:

$$\text{Next State} = f[\text{Current State, Inputs}]$$

where f is a function which depends on the combinational logic within logic gate block 202.

Because sequential circuits, such as state machine 200 constitute a general form of digital logic, many logic circuits can be modeled as a collection of state machines. Because state machines may possess states which cannot be reached or should be excluded, accurate analysis of each state machine is important for effective synthesis and simulation of complex digital circuits.

Figure 3:
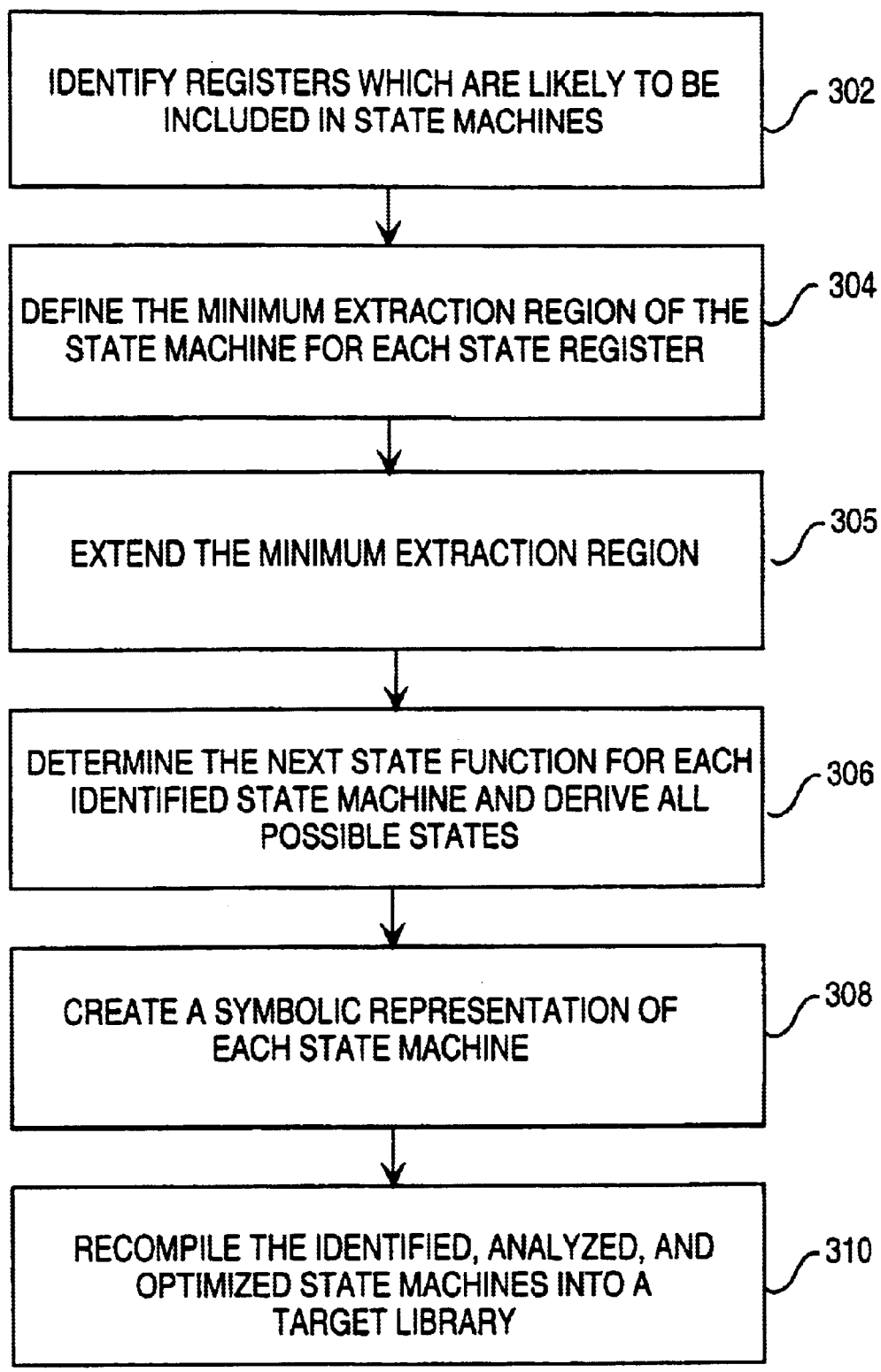
FIG. 3 is a flowchart illustrating the process of automatically extracting state machines according to one embodiment of the present invention.

An embodiment of the present invention is intended for use with hardware description language design synthesis software, although the invention is not limited to such use. A method of the present invention automatically identifies and extracts state machines within a circuit and creates netlists of the state machines. This process facilitates the analysis and optimization of the sequential logic circuits which make up these state machines, after they have been automatically extracted. FIG. 3 is a flowchart which illustrates a method of extracting state machines within a digital circuit, according to one embodiment of the present invention. It will be appreciated that the method of FIG. 3 is part of a larger process of logic synthesis, such as the process shown in FIG. 1B. Thus, FIG. 3 typically begins after step 133 of FIG. 1B. That is, step 302 of FIG. 3 uses the synthesized, RTL netlist description from step 133. In one embodiment of the invention, the user of the logic synthesis process of FIG. 1B may be presented with an option of enabling or disabling the automatic extraction of state machines. If the automatic extraction process is disabled then the system does not use the method of FIG. 3, and logic synthesis follows the process of FIG. 1B. If automatic extraction is enabled, then the process of FIG. 3 begins after step 133 of FIG. 1B.

In step 302, the entire circuit to be analyzed or modeled is filtered to determine which registers are likely to be part of state machine circuits. This step serves to remove extraneous circuitry such as combinational logic devices which are not coupled to registers and non-state registers (which do not have a feedback path from an output of the register back to an input to the register). In one embodiment of the present invention, the identification step 302 is performed by identifying those portions of circuitry which possess flip-flops or registers connected to combinational logic through one or more feedback paths. A circuit consisting of a register and feedback path from the register's output to its input, such as that illustrated in FIG. 2, may usually be correctly identified as a state machine. A register which stores the current state of a state machine within a state machine is referred to as "state register." Step 302 searches through the RTL netlist description for all registers which have combinational logic in a feedback path of the register. Each register which has such logic in its feedback path is labeled as a candidate state register. Registers which do not have feedback paths (from output to input) are considered to be non-state registers. In one particular embodiment, registers in counters and arithmetic logic are considered to be non-state registers (in order to reduce analysis time for such logic which does not often benefit much from optimization). Thus, in step 302, non-state registers and those circuit elements which do not appear to be part of state machines are excluded from the circuit to be analyzed.

In an alternative embodiment of the present invention the initial identification and filtering step 302 is not required. Instead, the definition of minimum extraction regions (which is described below as step 304) around each register within a circuit to be analyzed would serve to identify those circuits which are state machines. This initial identification and processing step 302, however, does remove the additional processing overhead incurred by the definition of minimum extraction regions around each register and subsequent filtering of incorrectly identified registers.

Figure 4:
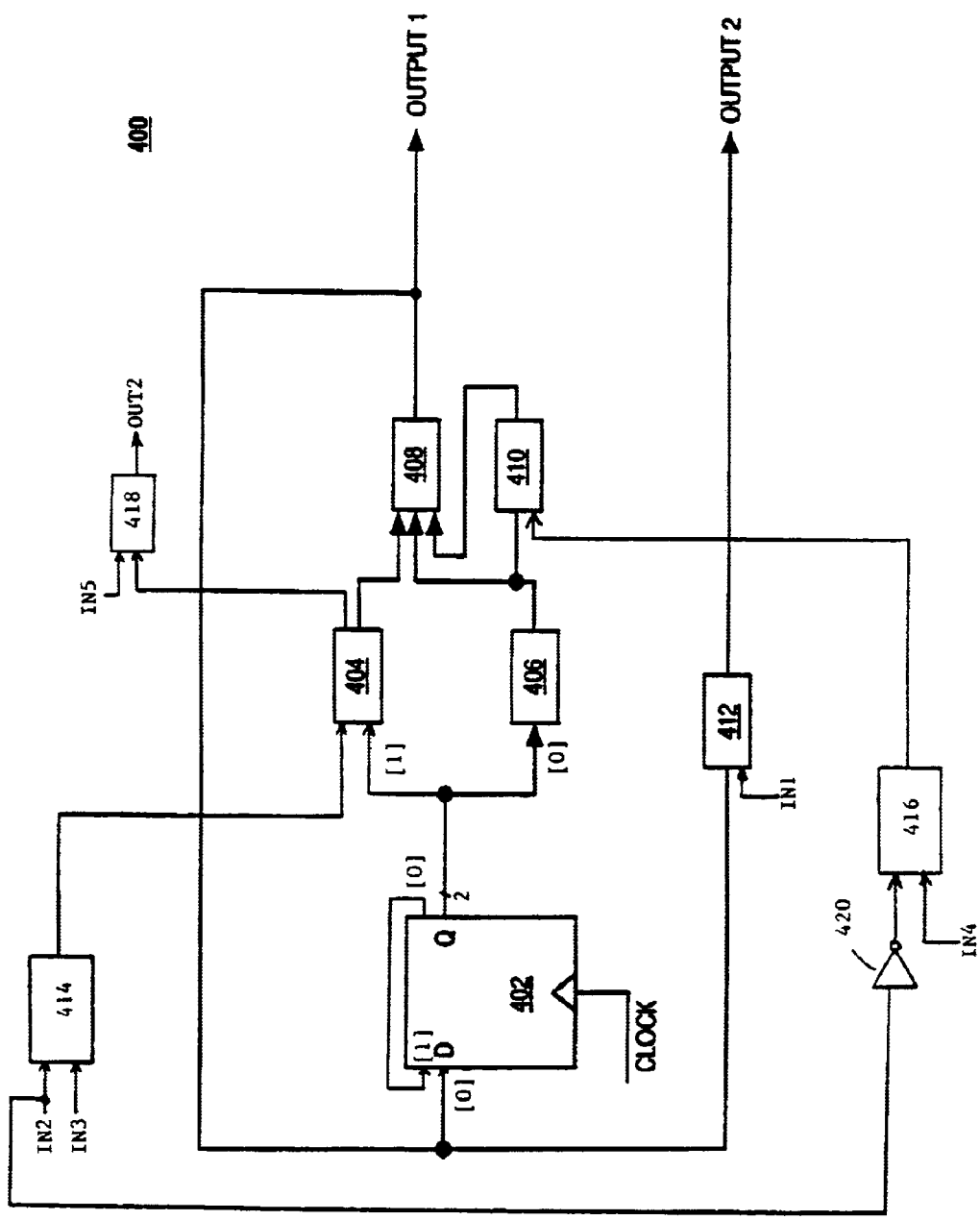
FIG. 4 is a block diagram of a circuit including a state machine.

In step 304 the actual state machine circuitry associated with each of the state registers identified in step 302 is defined. The region which corresponds to the minimum group of gates which comprise the state machine is referred to as the "minimum extraction region." In one embodiment of the present invention, the minimum extraction region for a state register is defined by determining all of the devices included within the feedback path of the state register. A feedback path is defined as thee path from the output terminal of a state register to the input terminal of that state register. Any device between those terminals of the state register will be considered to be in the minimum extraction region. Thus, any combinational device which both receives one input which is traceable (coupled electrically) back to the state register's output and provides one output which is traceable (coupled electrically) forward to the input of the state register will be considered to be in the feedback path of the state register and will be in the minimum extraction region. FIG. 4 is a block, diagram which illustrates the minimum extraction region of circuit 400 which includes a state machine. Circuit 400 consists of D flip-flop register 402 and several logic devices 404, 406, 408, 410, 412, 414, 416, 418, and 420. An input signal is input to register 402 and logic device 412. The output of bit "1" and of bit "0" from register 402 is input respectively to devices 404 and 406, which, in turn, propagate the signal to devices 408 and 410. The output from device 408 is fed back to the "0" bit input (least significant bit) of register 402. Circuit 400 provides two output paths. Output 1 originates from device 408 and output 2 originates from device 412. The "0" bit output from register 402 is fed back to the "1" bit input of the register 402. The feedback path from the Q output of register 402 to the D input of register 402 defines the minimum extraction region of the state machine within circuit 400. In circuit 400, the minimum extraction region of the state machine consists of register 402 and devices 404, 406, 408, and 410. Device 412 is not part of the minimum extraction region of the state machine since output 2 is not connected back to register 402. That is, device 412 is not within the feedback path for register 402 since none of its outputs are coupled to the input of the state register 402. Devices 414, 416, 418, and 420 are also not part of the minimum extraction region of the state machine of circuit 400. Device 414 is not part of the minimum extraction region because none of its inputs are coupled to the output of the register 402. Similarly, device 416 is not part of this region. Device 418 is not part of this region because none of its outputs are coupled back to the input of the register 402. The input of inverter 420 is not coupled to an output of the register 402, and thus inverter 420 is not part of this region.

After the minimum extraction region for each state machine has been defined, each of these regions is extended for further analysis. This is shown in step 305 of FIG. 3. This extension serves to determine all the necessary inputs to the state machine without also including signals which are in fact not inputs which effect the state machine. In one embodiment of the present invention the minimum extraction region is extended by applying a cutting algorithm to the circuit. The cutting algorithm is a well known algorithm which is referred to as a minimum cut (or cutting) algorithm. This algorithm determines all of the valid input combinations to the state machine and minimizes invalid input combinations. Invalid input combinations are those inputs which create input states which cannot logically exist within the state machine, e.g., input=0 and input bar=0 at the same time.

The extension of the minimum extraction region for the state machine of FIG. 4 will attempt to determine the valid input combinations and to disregard the invalid input combinations. It can be seen from FIG. 4 that the valid input combinations to this state machine are determined by IN2, IN3 and IN4, and associated logic, and inputs IN5 and IN1 do not effect the next state of the state machine of FIG. 4. The extension of the minimum extraction region selects candidate signals and logic outside of the minimum extraction region in order to minimize the invalid input combinations.

The minimum cutting algorithm searches the combinational logic feeding the inputs to the logic in the minimum extraction region in order to find the proper inputs and associated logic for the state machine. Typically this involves tracing the signal paths from the inputs to the logic in the minimum extraction region back to inputs within the entire circuit. As the signal paths are traced, the associated logic in the path is determined. Thus, as shown in FIG. 4, the inputs to the logic in the minimum extraction region are traced back to the outputs from devices 414 and 416, and their corresponding inputs which are inputs IN2, IN3, and IN4. Tracing back further reveals inverter 420.

One technique for applying the minimum cutting algorithm is to determine the number of signals entering the logic in the minimum extraction region (e.g. there are 4 signals entering into the minimum extraction region of FIG. 4), and then search back from the inputs to this logic to find a multiple of this number of signals (e.g. 4 times the number of signals entering into the minimum extraction region). Then the minimum cutting algorithm is applied to this extended region and the number of signals is usually reduced to the actual inputs which effect the state machine. The result of this algorithm is that certain signals are not included as inputs in the valid input combinations. Thus, an inverter may be recognized by the algorithm as providing a signal which is not to be included as an input in the valid input combinations. In the case of FIG. 4, the inverter 420 merely inverts the signal IN2 and thus the output from the inverter 420 does not need to be considered separately as one of the possible input signals to the state machine, and the minimum cutting algorithm would not include inverter 420's output because including it would result in a higher value of a "cut."

In an alternative embodiment of the present invention, the cutting algorithm assigns weights to each of the input signals and determines which input signals are valid by applying a weighted product relationship to these input signals. For example, user named input signals are assigned one weight value (a first value) which is lower than other signals (which are not named by the user), inputs for vector signals are assigned a second value, and unnamed signals and non-vector (non-grouped) signals are assigned a third value. Typically, the second value is lower than the third value; the first value may be the same as or lower than the second value. A weighted filter technique is then employed to determine which input signals are the proper inputs to the state machine. Again, the minimum cutting algorithm "cuts" the input signal lines at various places in the circuit (each cut representing a particular group of signals) and selects the group of signals which provide the lowest sum of weighted signals. The devices within the feedback loop corresponding to the selected input signals are then included within the extended minimum extraction region.

In a further alternative embodiment of the present invention, the cutting algorithm derives the minimum transition region by measuring fanout and reconvergence associated with each input signal to a device within the minimum extraction region of a state machine. Reconvergence occurs in a circuit when a path can be traced back to a single signal from more than one input to the minimum extraction region. Fanout and reconvergence is the process of propagating a single signal through more than one device to produce multiple signals which then reconverge to a single output signal by a terminal device. Fanout and reconvergence of an input signal may cause phantom states or phantom transitions or phantom transition conditions (transition conditions which could not occur in the state machine) within the state machine due to the maintenance of various states through the propagation of the input signal through the various devices. The method according to this embodiment of the present invention identifies the fanout and reconvergence paths of the input signal and includes these circuits within the extended minimum extraction region, thus eliminating the phantom states created by these devices. That is, the input signal is derived and included within the state machine before it is propagated through the various gates which may cause a fanout and reconvergence effect.

In another alternative embodiment, the minimum extraction region may be extended or augmented with information about the correlation of input signals to the minimum extraction region. This can be done by including Boolean information about the input signal correlation, or by including circuitry generating the input signals that cause the correlation. For example, the output of a 2-4 decoder could be driving the inputs of the minimum extraction region. The values of these inputs are correlated because it is known that only one of the signals can be true at one time. One can encode this correlation in a Boolean expression that must be true which can be used to rule out transitions that only happen when the given expression is false. Alternatively, one can extend the extraction region to include the circuitry responsible for the correlation.

Determining State Machine Symbolic Representation

Once the minimum extraction region for a state machine has been identified and extended as described above, the state function for the state machine is determined. This is shown as step 306 in FIG. 3. The next state function is determined by converting the interconnected logic devices in the extended extraction region into a Boolean logic representation. This involves deriving a Boolean logic expression from these logic devices and their associated signal paths. The inputs to the Boolean logic expression (excluding the state value input) will be those same state machine inputs derived from the process of extending the minimum extraction region, which process was described above. The state value is also an input to this Boolean logic expression. A generalized representation of this Boolean logic expression is:

Next State=$f$[State Value, Inputs]

Once this expression is created, the process selects, in the manner described below, an initial state value and all permutations of the inputs are applied to the Next State function to determine all possible state values (or states) of the state machine from the initial state value. In particular, all permutations of the inputs are applied to the Next State function while keeping the state value set at the initial state value. This produces a set of next state values from the initial state value. Next, all permutations of the inputs are applied to the Next State function for each state value in the current set of next state values, and this process produces further state values (if any) which are added into the set of next state values. This process continues until no further state values are produced. The result is a complete list of all possible states.

For one embodiment of the present invention, if the state machine has an asynchronous reset state (e.g. the RTL netlist specifies a reset signal and a value for the resetted state), then this state defines the initial state for the state machine in the region of the circuit. If there is no asynchronous reset signal and no other reset condition such as a common state can be found, then the region will not be extracted and no further attempt is made to extract and/or analyze state machine in this region. The determination of all possible states of the state machine is used to determine a common state of the state machine if no asynchronous reset signal can be found. A common state is one which the state machine reaches regardless of the value of the current state. If such a common state exists, this state is considered the initial state and corresponds to a synchronous reset state. A specific embodiment for determining a synchronous reset state will now be provided.

The method to determine a synchronous reset state uses two standard Boolean function operators known as "Consensus" and "Smooth," and these operators are referred to in the literature concerning finite state machine traversal. This literature describes the method for determining all possible states (and associated inputs) given an initial state for a state machine. Consensus and Smooth are two functional operators that are commonly used when manipulating sets which are represented implicitly.

One can represent a set as a function that returns a Boolean value of true or false when applied to a candidate member of the set. For example, one could have a function "is_even" that can test integers to see if they are divisible by 2. This function then implicitly defines the set of even numbers as opposed to an explicit list of members, which is impossible for infinite sets and impractical for very large sets.

Suppose there are a set of pairs of values (a, b) where a is a member of A-Set and b is a member of B-set. This set can be defined in terms of a membership function M(a, b) that returns true when the pair (a, b) is in the set and false when (a, b) is not in the set.

One operation on the membership function M(a, b) that one may want to perform is to determine which values of a make M(a, b) true no matter what the value of b is. This operation is:

$$F(a)=\text{Consensus } (M(a, b), b)$$

Another operation on the membership function M(a, b) that one may want to perform is to determine the values of a for which there exists a value for b such that M(a, b) is true. This operation is:

$$S(a)=\text{Smooth } (M(a, b), b)$$

Both of these operations have efficient implementations when a and b are represented as Boolean vectors and M is represented as a Bdd (Binary Decision Diagram).

A synchronous reset state may then be determined by calculating an implicit next state function ("INS"):

$$INS (S', S, I) \equiv NS(S, I)$$

In this expression, NS represents the next state function (which was determined from the extended minimum extraction region), S represents state value, S' represents a next state, and I represents the inputs. The Consensus operator is then used to find conditions for all possible current states where the inputs control the next state independent of the current state. This removes references to the current state from INS, thereby producing a function designated as R(S', I). In particular, $$R(S', I)=\text{Consensus } (INS(S', S, I), S)$$

Then, a function Q (S') which does not depend upon the inputs is provided by:

$$Q(S')=\text{Smooth } (R(S', I), I)$$

This method efficiently provides an initial state in the case where the initial state is a synchronous reset state.

After determining an initial state, such as a synchronous reset state (or using the discovered asynchronous reset state if the state machine uses an asynchronous reset which can be determined), the conventional finite state machine (FSM) traversal may be applied to produce a listing of all reachable states. In one embodiment, this traversal may be performed in the manner described by the following pseudocode:

```
genreach=Smooth (INS(S', S, I),I);
lastreachset=empty;
reachset=initialset;
while (reachset!=lastreachset) {
lastreachset=reachset;
r=genreach & reachset;
r=Smooth (r, S);
r=Map S' to S (r); /* relabel S' vars to S vars/
reachset=r|reachset; /* add in new states */
}
```

Other descriptions of FSM traversal may be found in the literature, including, for example, *Logic Synthesis and Verification Algorithms*, by Gary Hachtel and Fabio Somenzi (Klauwer Academic Publishing, 1996).

Once all possible states of a state machine have been determined, a symbolic representation of the state machine is created. This is illustrated as step 308 in FIG. 3. For one embodiment of the present invention, a symbolic representation of the state machine may be represented as a state table which relates the next state produced by a combination of a present state and given input values. For such a table, one column presents the possible input values to the state machine, a second column presents the possible current state values, and a third column presents the next state produced by a given current state and set of input values. Alternatively, the symbolic representation could be provided in the form of a state diagram or a similar graphic representation.

Figure 5A:
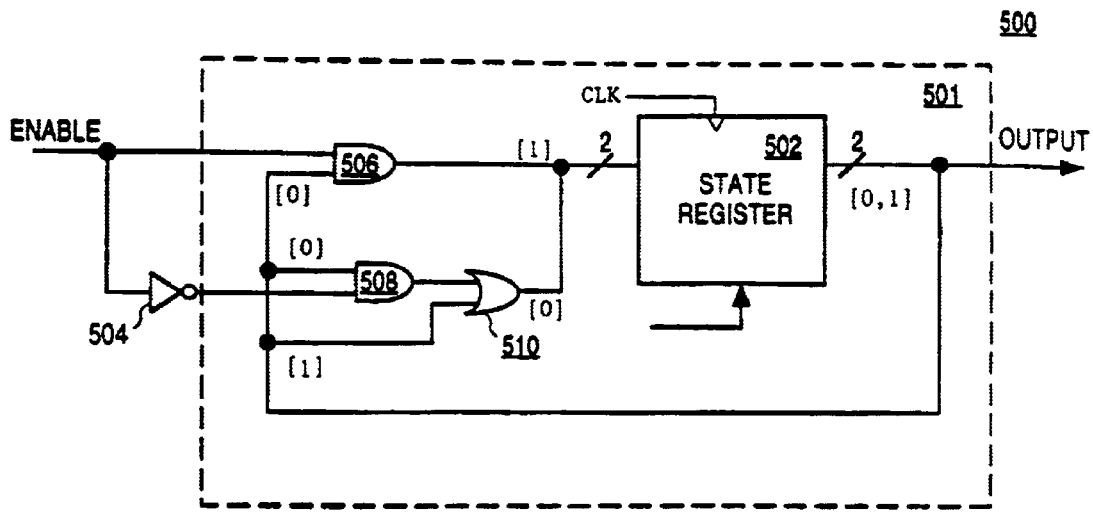
FIG. 5A is a block diagram illustrating a minimum extraction region within a circuit including a state machine.

An example of a resulting state diagram (shown in FIG. 5B) will be briefly described in conjunction with the state machine shown in FIG. 5A. Circuit 500 includes a state register 502 and several combinational logic gates 504, 506, 508, and 510. In circuit 500, an enable signal is input to an inverter 504 and an AND gate 506. The output from AND gate 506 is input to the 2-bit D input of state register 502. The 2-bit output from state register 502 forms the output signal from circuit 500. This output signal, having a first bit "[0]" and a second bit "[1]", is also fed back. The first bit "[0]" may be considered a least significant bit (LSB) and the second bit "[1]" may be considered a most significant bit (MSB). The AND gates 506 and 508 each receive as an input the feedback of the LSB from the state register 502, and the OR gate 510 receives feedback of the MSB as an input. The output of the AND gate 506 is provided on the MSB input to the register 502. The output from OR gate 510 is connected to the LSB input of state register 502. The asynchronous reset signal resets the state value in the state register to "01" when the reset signal is asserted. The feedback path from the output of state register 502 to the input of state register 502 defines the minimum extraction region for circuit 500. The minimum extraction region associated with state register 502 is enclosed within a dashed line and denoted circuit 501. Inverter 504 is not included within the minimum extraction region 501 since the feedback loop from the output from state register 502 does not pass through the input of this device.

Figure 5B:
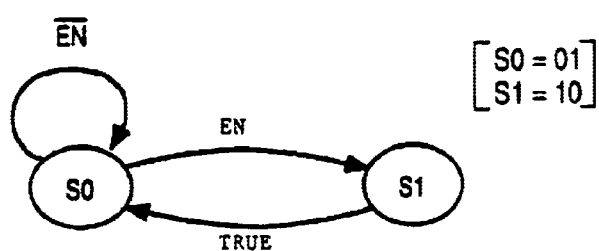
FIG. 5B is a state diagram for the state machine illustrated in FIG. 5A.

FIG. 5B is a state diagram which illustrates the states and state transitions produced by circuit 500 of FIG. 5A. Circuit 500 represents a two-state machine based upon the input value of the enable signal. State S0 in FIG. 5B has a state value of "01" and represents the state when the enable signal is at a logic low ("0"), and state S1 has a state value of "10" and represents the state when the enable signal is at a logic high ("1").

At step 308, the present invention may, in one embodiment, optimize and debug the state machine using the symbolic representation produced by step 308. This optimization and debugging may include removing unreachable states and merging equivalent states. The optimization and debugging of a state machine from a symbolic representation is well known in the art. After the optional optimization and debugging, the optimized symbolic representation of the state machine is used to recompile the state machine into a compiled HDL design. If no optimization and/or debugging is performed, then the symbolic representation may be used to recompile the state machine into a compiled HDL design.

In one embodiment, a method of the present invention is used in conjunction with a HDL synthesis program which converts HDL designs into device netlists for a target architecture. For this embodiment, the state machines identified by the methods described above may be recompiled into target libraries for use with the synthesis program. This is illustrated as step 310 in FIG. 3. The automatic state machine identification program is provided as a symbolic finite state machine compiler which optimizes, and re-encodes the identified finite state machines within a circuit design, and displays a report which illustrates the set of reachable states for each state machine. The errors reported for unreachable states provide an effective tool for debugging complex logic designs. Step 310 is typically performed with or as part of step 137 of FIG. 1B.

An alternative embodiment of the present invention allows the user to specify a particular register as being a state register (or specify a portion of a circuit containing a register which is a state register). In this alternative embodiment, the present invention processes the circuitry associated with the identified register in the manner described above rather than processing the entire circuit described by the HDL code.

Programming Example

In one embodiment of the present invention, the state machine extractor is used with a circuit design and synthesis Computer Aided Design (CAD) program which is implemented as a C program. This program is stored in a computer readable storage medium which may be a CD-ROM or a magnetic hard disk or an optical disk or any of the various alternative storage devices.

The steps of a method of the present invention may be implemented by a central processing unit (CPU) in a computer executing sequences of computer program instructions stored in a memory which may be considered to be a computer readable storage medium. The memory may be a random access memory (RAM), read-only memory (ROM), a persistent store, such as a mass storage device, or any combination of these devices. Execution of the sequences of instructions causes the CPU to perform steps according to the present invention. The instructions may be loaded into the memory of the computer from a storage device or from one or more other computer systems over a network connection. The instructions may be stored concurrently in several storage devices (e.g. DRAM and hard disk, as virtual memory). Consequently, execution of the instructions may be performed directly by the CPU. In other cases, the instructions may not be directly executable by the CPU. Under these circumstances, the instructions may be executed by causing the CPU to execute an interpreter that interprets the instructions, or by causing the CPU to execute instructions which convert the received instructions to instructions which can be directly executed by the CPU. In other embodiments, hardwired circuitry may be used in place of, or in combination with, software instructions to. implement the present invention. Thus, the present invention is not limited to any specific combination of hardware circuitry and software, nor to any particular source for the instructions executed by the computer.

In the foregoing, a system has been described for identifying and extracting state machines from a complex digital circuit design. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

Recovery from an Invalid State

Recall the discussion in the background relating to various state machine design extremes. At one extreme, all invalid states are effectively implemented as valid states in the sense that the state machine's recognition of each invalid state and the transition back to a valid state is incorporated along with valid state recognition and transition logic. In this approach, the designer specifies the circuit's operation within all invalid states. Complicated recovery mechanisms are possible such as specifying that a transition to a first invalid state should follow with a transition to a certain valid state (e.g., "S1"); while a transition to a second invalid state should follow with a transition to a different valid state (e.g., "S2").

Implementing all invalid state logic along with valid state logic results in large area consumption and reduced speed of operation; however, the circuit can handle unexpected jumps to an invalid state. An example of a design process that may be used to implement such a design choice is shown with respect to FIG. 1. That is, the circuit is implemented exactly as encoded by the designer without modification by finite state machine extraction or some other process that modifies the designer's original encoding.

The other end of the state machine design spectrum, as discussed in the background, excludes logic necessary to recognize an invalid state (and then transition the state machine back to a valid state). As such the invalid states are assumed to be unreachable. Such approaches are best suited, for example, in environments having no exposure to an invalid state transition. Removing logic devoted to operation within an invalid state results in minimal area consumption as well as minimal circuit execution time. The automatic state machine extraction process described with respect to FIGS. 2 through 5 may be used for this type of approach.

For example, as discussed, the symbolic state machine representation produced by the automatic extraction process (e.g., symbolic representation 5B of FIG. 5) may only address reachable (i.e., valid) states as designed by the designer and as discovered by the cutting algorithm. This symbolic state machine representation may then be inserted into (simultaneously replacing the corresponding original statements within) the designer's original symbolic representation of his/her entire circuit.

This modified version of the designer's original symbolic representation of his/her circuit can then be compiled into a second RTL netlist (recalling that the extraction process begins with an RTL netlist from the designer's original representation of his/her circuit) for subsequent technology specific optimization. The conversion into the second RTL netlist (and/or perhaps the technology specific optimization as well) may produce state registers for the state machine that, in total, can store state spaces beyond those reachable states discovered by the cutting algorithm. These states may be referred to as unreachable, invalid or unused states.

Thus, although a symbolic representation (e.g., the symbolic representation of FIG. 5B) of a state machine does not need to address transitions to/from an unused state, when that symbolic representation is converted into an actual circuit (e.g., the circuit of FIG. 5A), the presence of registers used to implement the state machine may result in the physical existence of unused states that may be undesirably transitioned into. With no logic "designed in" to protect against such a transition, the circuit is exposed to locking up within an invalid state or set of states.

With this type of approach, as discussed, the cutting algorithm effectively determines which states are invalid (i.e., unreachable) and the state machine is modeled according to the model 200 of FIG. 2. Thus, logic gates 202 are absent of logic devoted to recognizing the presence of an invalid state and/or transitioning the state machine back to a valid state from an invalid state. Thus, the automatic state machine extraction process described with respect to FIGS. 2 through 5 may be used to construct state machines at another end of a design point spectrum having minimal surface area and temporal delay but least prepared for an unexpected jump to an invalid state.

Figure 6A:
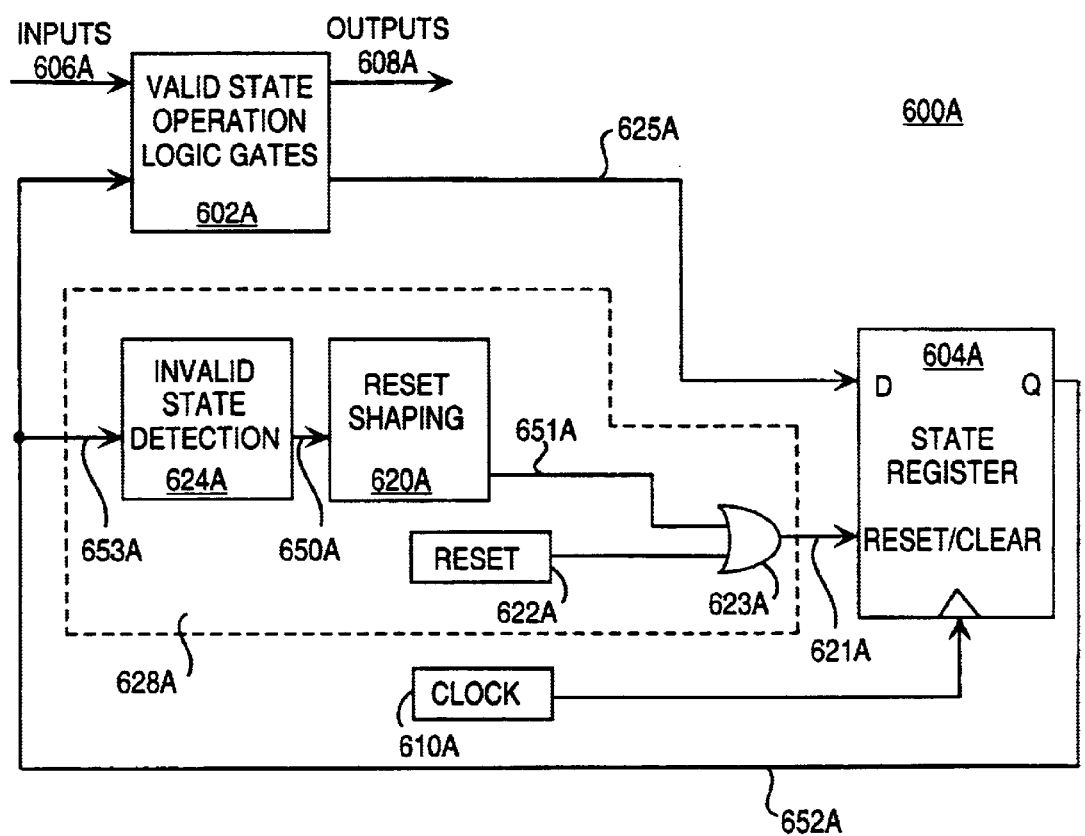
FIG. 6a is a depiction of a first "safe" state machine design point.

As discussed in the background, however, many circuit design applications are best served by having some form of invalid state recovery without introducing significant circuit delay. FIG. 6a, shows an embodiment 600a of a state machine model that may be utilized to satisfy these constraints. The embodiment 600a of FIG. 6a, resets the state machine at the state register 604a reset input 621a if an invalid state is reached. The output state of the state register 604a after the state register is reset should be a valid state in order to rid the state machine of the invalid state. Reset circuit 628a is responsible for: 1) recognizing an invalid state and 2) resetting the state register 604a.

The presence of an invalid state is detected by invalid state detection logic 624a. Once an invalid state is detected, the proper reset signal is crafted by reset shaping logic 620a and then sent to the state register reset input 621a. Note that the reset associated with invalid state recovery may be ORed 623a with a system reset 622a or other reset mechanism needing input to the state register 604a reset input 621a.

Reset circuit 628a may be designed to provide coverage against all invalid states unlike, for example, a state machine modeled according to the model 200 of FIG. 2 (which treats the invalid states as unreachable). Thus, note that, the model 600a of FIG. 6a introduces a reset circuit 628a to the model 200 of FIG. 2. Furthermore, even though all invalid states may be recognized and properly transitioned from by model 600a of FIG. 6a, the presence and operation of reset control circuit 628a does not substantially affect the speed of the state machine's operation within valid states.

The ability to maintain low circuit delay results from the separation of the valid state logic 602a from the reset control circuit 628a. That is, as valid state operation logic gates 602a are not further complicated with the addition of invalid state recovery logic, logic gates 602a operate at approximately the same speed as a logic gates 202 of state machine 200 having no logic devoted to handling the presence of an unreachable states (referring briefly back to FIG. 2).

Note that reset control circuit 628a may be viewed more generally as a form of invalid state logic that is separated from valid state logic 602a. In other embodiments, the invalid state logic 628a may be directed to other register 604a inputs, besides the reset input 621a (e.g., a data input such as R or S for an RS flip flop). Valid state logic 602a is designed to be responsive to a valid state from a state register. Invalid state logic 628a is designed to be responsive to an invalid state from a state register. The lack of overlap between invalid state logic 628a and valid state logic 602a keeps the speed of state machine 600a, for valid state operations, comparable to the speed of a state machine with its invalid states removed as unreachable states.

Simulations indicate that the speed of valid state operation may be slightly slower for designs implemented according to the embodiment 600a of FIG. 6a as compared to designs having their invalid states removed as unreachable states (e.g., embodiment 200 of FIG. 2). The slightly slower operation is believed to be caused by the additional loading on the feedback net 652a (that is used to feedback the state of register 604a to valid stage logic 602a) caused by the input 653a to invalid state logic 628a. Thus, in order to increase the speed of circuits having separate invalid state logic 628a, the fanout on feedback net 652a should be minimal. In various embodiments, invalid state logic 628a has only one input 653a to reduce its effect on the voltage risetime on feedback net 652a.

Figure 6B:
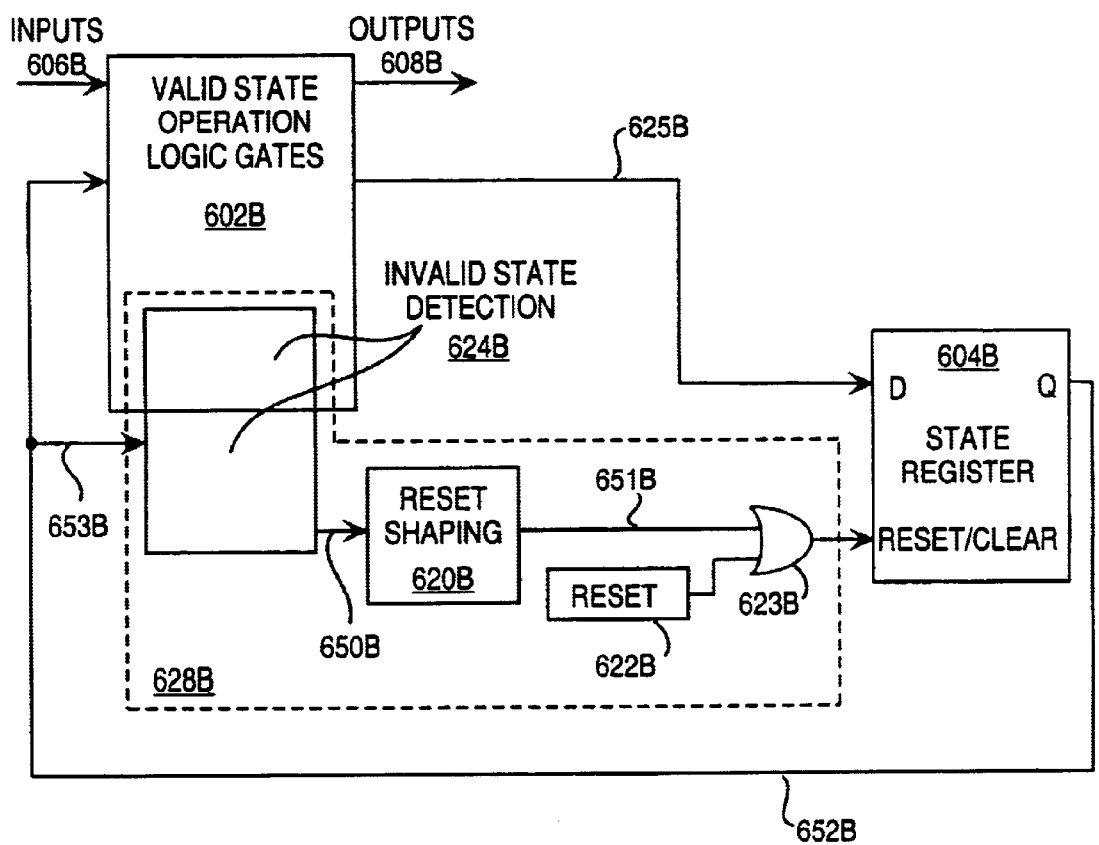
FIG. 6b is a depiction of a second "safe" state machine design point.

Referring to FIG. 6b, note that other circuit designs may be better served by overlapping, to some degree, the valid state logic 602b with the invalid state logic 628b. That is, valid state and invalid state operations occur within the same logic block on a particular semiconductor die location. Approaches that follow the approach of FIG. 6b are typically more concerned with conserving surface area than maintaining speed of operation. Implementing completely separate invalid state logic 628a, as shown in FIG. 6a, can minimize the delay of valid state operation (for approaches choosing not to ignore the possibility of an invalid state) but at the cost of increased device layout complexity.

By introducing some amount of invalid state logic 624b into the logic gate region 602b that performs valid state operations, the valid state operational delay is increased but device surface area can be conserved. Technology independent or vendor specific technology optimization processes associated with a design tool may be employed to help determine the proper degree of overlap.

Various design flows may be used to implement the various state machine designs discussed so far. Referring back to FIG. 1, recall that the basic process for designing a semiconductor IC involves describing the circuit in some form of symbolic representation 131 and then converting the symbolic representation into a circuit 133 (e.g., an RTL netlist) having circuit elements such as logic gates and registers.

To first order, in order to implement any of the state machine approaches described so far, the particular approach may be directed by the designer him/herself within his/her symbolic representation or its conversion into a circuit. For example, a designer's symbolic representation of a state machine may call out a particular state machine profile that corresponds to a particular approach. One profile may correspond to the approach described with respect to FIG. 2 (i.e., treating unused states as unreachable). Another profile may correspond to the approach described with respect to FIG. 6a. Yet another approach may correspond to the approach described with respect to FIG. 6b.

A versatile design tool may present any of these approaches as an option to the designer for any state machine implementation. Thus, once a designer decides to expressly specify a state machine, the designer may next choose which approach he/she prefers. The design tool provides an environment suitable for entering the state machine consistent with the approach chosen by the designer and subsequently converts and/or optimizes an implementation of the state machine consistent with the approach called out by the designer in his express description of the state machine.

For example, if a designer chooses the approach shown with respect to FIG. 6a, the design tool may allow the designer to enter:
 when others=>;
 state <=RESET
During the conversion into an RTL netlist, the design tool may then build invalid state logic 628a such that the invalid state detection circuit 624a identifies the "other" states.

Figure 7:
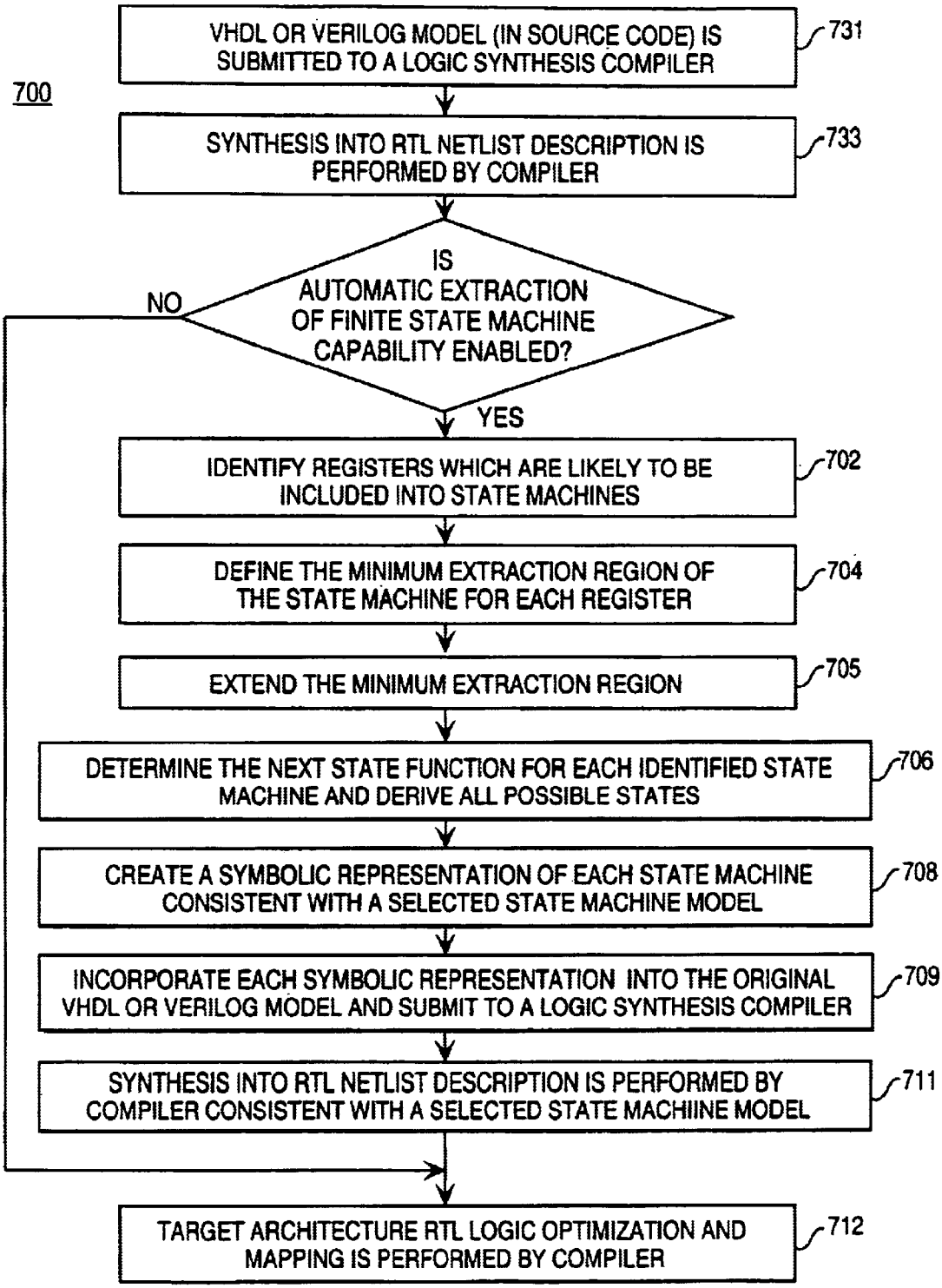
FIG. 7 is an example of a deign methodology that may be used to implement different state machine design points.

Thus, referring to FIG. 7 (and comparing with FIG. 1), the particular design point chosen by the designer is specifically encoded by the designer and then compiled both with a logic synthesis compiler 731 and then into an RTL netlist 733. Since the finite state machine is defined by the designer, automatic extraction is not necessary for the particular state machine and the RTL netlist is then optimized within a specific technology 712.

In other approaches, however, the designer does not explicitly describe a state machine but instead depends upon the design tool for state machine discovery and implementation. In this methodology, the design tool identifies one or more state machines within the designer's circuit and then replaces portions of the original representation with one or more automatically identified state machine representations.

An example is the automatic finite state machine extraction process described with respect to FIGS. 2 through 5. If the designer's application has no exposure to alpha particle hits he/she may choose to automatically extract state machines without regard for protection against reaching an unused state. Consistent with the description related to FIGS. 2 through 5, the design tool may implement a state machine as shown back in FIG. 2.

The methodology of FIG. 7, however, also allows for approaches that use either model 600a,b (or model 200 of FIG. 2) after execution of automatic finite state extraction. In the particular case where a designer prefers to implement an automatically extracted state machine consistent with the approaches of either FIG. 6a or FIG. 6b, after running a finite state machine extraction process 702, 704, 705, 706, 708 (e.g., similar to processes 302, 304, 305, 306, 308 of FIG. 3), invalid states normally ignored as unreachable may instead be handled through a form of symbolic representation for the invalid state logic 628a,b of FIG. 6.

Thus, the symbolic representation produced by the extraction process after sequence 708 may be consistent with the particular design point chosen by the designer. The designer's original symbolic representation is then modified 709 by replacing appropriate original representations with the automatically produced state machine representation.

Unused states are accounted for by the inclusion of invalid state logic (e.g., 628a,b) when the modified representation is compiled 711 into an RTL netlist. The RTL netlist is then submitted 712 to a target architecture. Further optimization for the vendor's specific technology may alter the overlap between the valid and invalid state logic regions if the designer so allows.

Note the design approaches presented in FIGS. 6a and 6b may be viewed as "safe" approaches as compared to the approach presented in FIG. 2 since the possibility of reaching unused states is accounted for rather than ignored. Note again that the approaches discussed with respect to FIGS. 2, 6a and 6b may all be implemented with the generic flow 700 of FIG. 7.

In summary then, a versatile design tool can offer the designer a sliding scale of finite state machine related tradeoffs. The identification of a state machine may be determined by the designer him/herself by designing into a particular model or environment according to his/her desired approach. Alternatively, a designer may choose to have the presence of state machines determined automatically by an extraction process. In either case, models such as models 600a and 600b may be implemented that provide for various levels of insurance against a transition to an invalid state as well as minimizing the impact as to surface area consumption and timing delay.

Figure 8A:
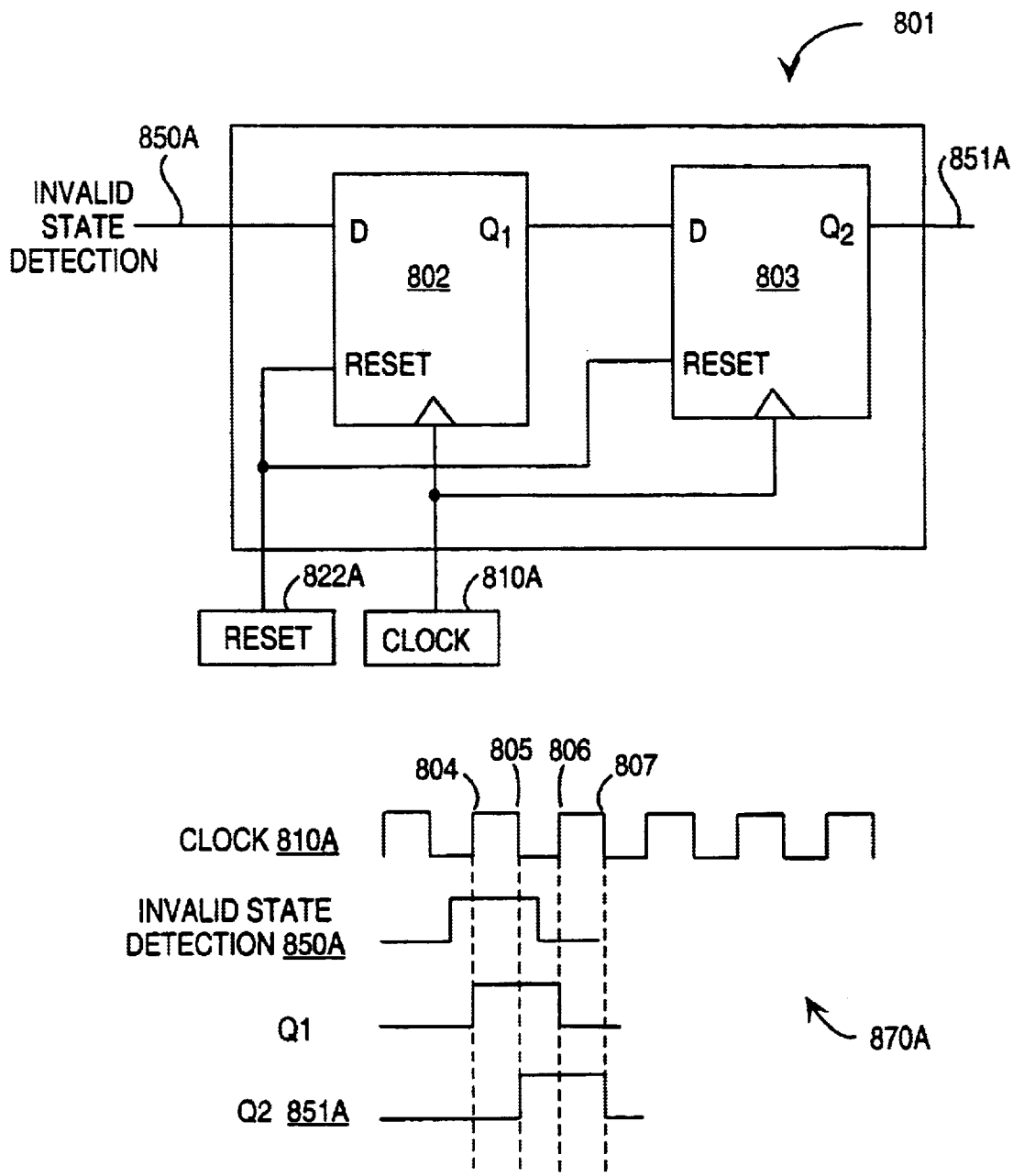
FIG. 8a is an example of an asynchronous reset for use with the "safe" design point model of FIG. 7.
Figure 8B:
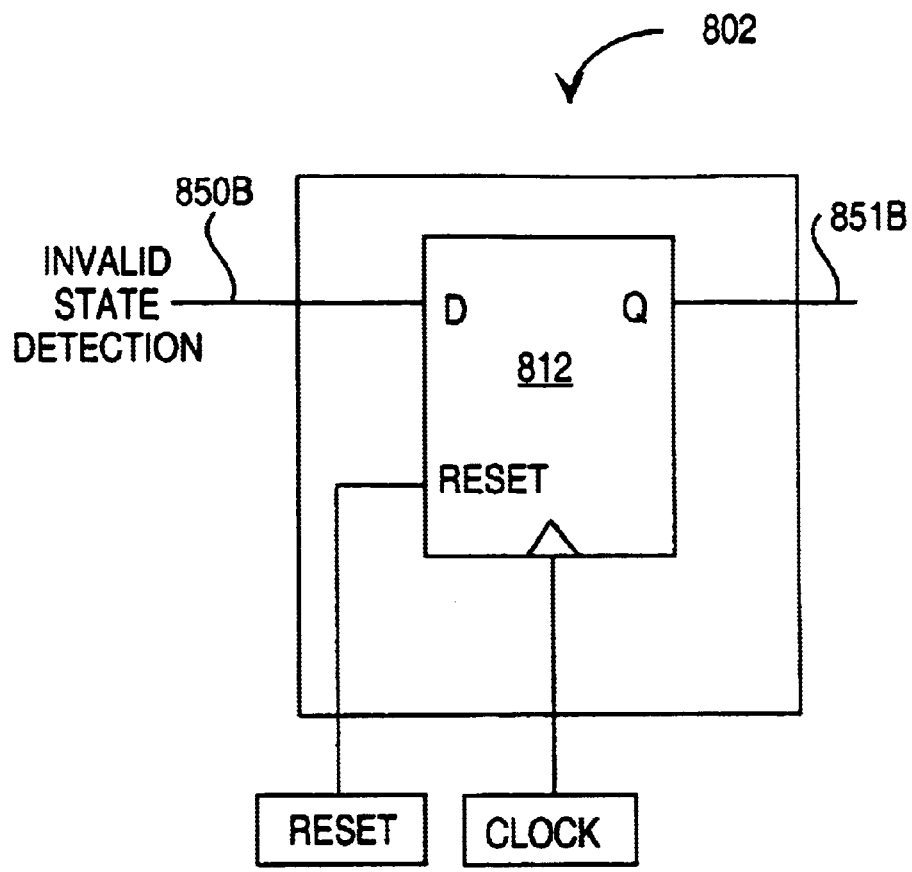
FIG. 8b is an example of a synchronous reset for use with the "safe" design point model of FIG. 7.

FIGS. 8a and 8b show two embodiments 801, 802 that may be used to implement the reset shaping logic 620a,b of FIGS. 6a,b. State registers are commonly reset in either an asynchronous or synchronous manner. For asynchronous resets, in order to prevent race conditions, the reset should be released (i.e., its transition from high to low for a positive reset signal) at a different moment in time than the rising edge of the clock (for positive edge triggered designs).

For synchronous resets, the reset and clock edges are approximately in a zero phase relationship. FIGS. 8a and 8b show an embodiment for each: the first embodiment 801 is a synchronous reset (shown in FIG. 8a) and the second embodiment 802 is an asynchronous reset (shown in FIG. 8b).

The inputs 850a,b to the reset shaping circuits 801, 802 correspond to the output 650a,b of the invalid state detection logic 624a,b of FIGS. 6a,b. The outputs 851a,b of the reset shaping circuits 801, 802 correspond to the reset shaping output 651a,b of FIGS. 6a,b. Note that both embodiments 801, 802 may also employ system reset 822a,b and clock 810a,b signals that correspond to the system reset 622a,b and clock 610a,b of FIGS. 6a,b.

The particular asynchronous reset embodiment 801 employs two DQ flip flops 802, 803. A flip flop is a type of register. As indicated in the corresponding timing diagram 870a, when an invalid state is detected, the first flip flop 802 is set on the next rising clock edge 804.

On the falling edge 805 of the same clock cycle, the second flip-flop 803 is set which asserts the reset at the state machine register 621a,b (of FIGS. 6a,b). At the next rising clock edge 806, the first flip flop 802 is reset. This example assumes, as shown in FIG. 8a, that the reset state is now present at the output of the state register. As shown, the invalid state detection output 850a responds to the valid reset state now present at the state register. On the next clock edge 807 the second flip flop 803 is also reset. Note that the reset signal is not released at a rising clock edge.

The synchronous embodiment 802 employs a single flip flop 812 (since the reset release may occur on the rising edge of the clock). Referring to the timing diagram 870b, if an invalid state is detected, the flip flop 812 is set on the next rising clock edge 808. The reset is asserted at the state machine register input 621a,b (of FIGS. 6a,b) at the next rising clock edge 809. Subsequently, the invalid state detection logic 624*a,b* (of FIGS. 6*a,b*) recognizes the reset state (which is a valid state). On the next rising clock edge 810, the flip flop is reset.

Figure 8B:
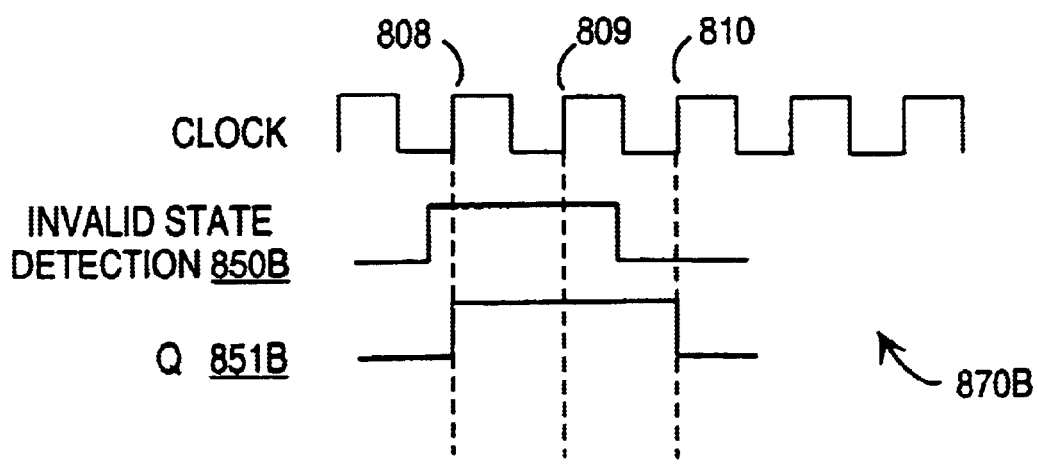

Referring back to FIGS. 6*a,b*, it is important to note that asynchronous or synchronous designs for use within the reset shaping logic 620*a,b* of reset circuit 628*a,b*, different than the specific embodiments shown in FIG. 8, may be used by those skilled in the art. Furthermore, various invalid state detection logic 624*a,b* designs and their particular output(s) 650*a,b* used to drive the reset shaping logic 620*a,b* may also be incorporated by those of ordinary skill. In various embodiments, additional registers may be added in the reset signal path so that the reset signal meets various timing requirements.

What is claimed is:

1. A method for designing a circuit, comprising:
    a) determining a state machine design point from a plurality of state machine design point options, a state machine design point option of said plurality of state machine design point options corresponding to a safe design point; and
    b) forming a safe state machine circuit model, if said safe design point is said determined state machine design point, said safe state machine model having valid state logic separated from invalid state logic.

2. The method of claim 1 wherein said forming a safe state machine circuit model further comprises identifying the invalid states of a state machine.

3. The method of claim 2 wherein said forming a safe state machine circuit model further comprises forming an invalid state detection logic circuit model.

4. The method of claim 1 further comprising executing a cutting algorithm to extract a symbolic state machine from an RTL design-associated with an automatic state machine extraction method.

5. The method of claim 4 wherein said forming a safe state machine circuit model further comprises adding a reset circuit to a state machine circuit model formed by said automatic state machine extraction method.

6. The method of claim 5 wherein said reset circuit is a synchronous reset circuit.

7. The method of claim 5 wherein said reset circuit is an asynchronous reset circuit.

8. The method of claim 1 wherein said safe state machine model further comprises said valid state logic partially overlapping said invalid state logic.

9. The method of claim 1 further comprising adding delay to a circuit path within said invalid state logic.

10. A method of operation for a circuit, comprising:
    a) detecting an invalid state of a state machine with invalid state logic;
    b) setting a state machine register to a valid state with said invalid state logic; and
    c) continuing valid state operation of said state machine with valid state logic, said valid state logic separated from said invalid state logic.

11. The method of claim 10 wherein said setting a state machine to a valid state further comprises resetting said state machine.

12. The method of claim 11 wherein said resetting a state machine further comprises resetting said state machine with a synchronous reset.

13. The method of claim 12 wherein said resetting a state machine further comprises resetting said state machine with an asynchronous reset.

14. The method of claim 12 wherein said detecting an invalid state is performed with a look-up table.

15. The method of claim 12 wherein said resetting said state machine further comprises processing a reset signal through a register.

16. The method of claim 15 wherein said processing further comprises propagating a reset signal through a plurality of registers.

17. A computer readable medium having stored thereon sequences of instructions which are executable by a digital processing system, and which, when executed by the digital processing system, cause the system to perform a method for designing a circuit comprising:
    a) determining a state machine design point from a plurality of state machine design point options, a state machine design point of said plurality of state machine design point options corresponding to a safe design point; and
    b) forming a safe state machine circuit model, if said safe design point is said determined state machine design point, said safe state machine circuit model having valid state logic separated from invalid state logic.

18. The computer readable medium of claim 17 wherein said forming a safe state machine circuit model further comprises identifying the invalid states of a state machine.

19. The computer readable medium of claim 18 wherein said forming a safe state machine circuit model further comprises forming an invalid state detection logic circuit model.

20. The computer readable medium of claim 18 further comprising executing a cutting algorithm to extract a symbolic state machine from an RTL design associated with an automatic state machine extraction method.

21. The computer readable medium of claim 20 wherein said forming a safe state machine circuit model further comprises adding a reset circuit to a state machine circuit model formed by said automatic state machine extraction method.

22. The computer readable medium of claim 21 wherein said reset circuit is a synchronous reset circuit.

23. The computer readable medium of claim 21 wherein said reset circuit is an asynchronous reset circuit.

24. The computer readable medium of claim 17 wherein said safe state machine model further comprises said valid state logic partially overlapping said invalid state logic.

25. The computer readable medium of claim 17 further comprising adding delay to a circuit path within said invalid state logic.

26. A computer readable medium having stored thereon sequences of instructions which are executable by a digital processing system, and which, when executed by the digital processing system, cause the system to perform a method for simulating operation of a circuit, comprising:
    a) detecting an invalid state of a state machine with invalid state logic;
    b) setting a state machine register to a valid state with said invalid state logic; and,
    c) continuing valid state operation of said state machine with valid state logic, said valid state logic separated from said invalid state logic.

27. The computer readable medium of claim 26 wherein said setting a state machine to a valid state further comprises resetting said state machine.

28. The computer readable medium of claim 27 wherein said resetting a state machine further comprises resetting said state machine with a synchronous reset.

29. The computer readable medium of claim 27 wherein said resetting a state machine further comprises resetting said state machine with an asynchronous reset.

30. The computer readable medium of claim 27 wherein said detecting an invalid state is performed with a look-up table.

31. The computer readable medium of claim 27 wherein said resetting said state machine further comprises processing a reset signal through a register.

32. The computer readable medium of claim 31 wherein said processing further comprises propagating a reset signal through a plurality of registers.

33. A method of operation for a circuit, comprising:
   a) detecting an invalid state of a state machine;
   b) registering a detection of said invalid state in a first register; and
   c) resetting a second register from said first register, said second register a state register of said state machine.

34. The method of claim 33 further comprising said detection occurring within invalid state logic which is in a pipeline of one or more registers, said one or more registers including said first register, said pipeline separated from valid state logic.

35. A machine readable medium having stored thereon sequences of instructions, which when executed by a processor, cause said processor to perform a method for simulating a circuit, said method comprising:
   a) detecting an invalid state of a state machine;
   b) registering a detection of said invalid state in a first register; and
   c) resetting a second register from said first register, said second register a state register of said state machine.

36. The machine readable medium of claim 35 wherein said acts further comprise said detection occurring within illegal state logic which is in a pipeline of one or more registers, said one or more registers including said first register, said pipeline separated from valid state logic.

37. A method for designing a circuit, comprising:
   determining a state machine design point from a plurality of state machine design point options, a state machine design point option of said plurality of state machine design point options corresponding to a safe design point in which a state machine is designed to transition to a valid state if an invalid state is reached by said state machine;
   executing an automatic state machine extraction process in order to define a region of a logic design to be represented by a state machine circuit model;
   forming a symbolic representation of said state machine circuit model; and,
   compiling said symbolic representation into said state machine circuit model wherein said state machine circuit model conforms to said safe design point, if said safe design point is said determined state machine design point, such that said state machine circuit model has valid state operational logic that couples a first register input and output together through feedback, said first register having a reset input coupled to a reset circuit, said reset circuit including a reset shaping circuit that shapes a reset signal sent to said reset input, said reset circuit also including invalid state detection logic that recognizes if said first register reaches an invalid state and triggers said reset shaping circuit to issue said reset signal in response, said reset shaping circuit including a second register that helps shape said reset signal, said valid state logic at least partially separated from said invalid state logic.

38. The method of claim 37 wherein said forming a symbolic representation of said state machine circuit model further comprises identifying invalid states of said state machine circuit model.

39. The method of claim 37 wherein said forming a symbolic representation further comprises developing an expression that describes the operation of said state machine circuit model according to:

Next State=$f$[State Value, Inputs].

40. The method of claim 37 wherein said compiling further comprises forming said safe state machine circuit model into an RTL compatible netlist.

41. The method of claim 37 further comprising incorporating said symbolic representation into a behavioral level description prior to said compiling.

42. The method of claim 41 wherein said behavioral level description is within a VHDL compatible format.

43. The method of claim 41 wherein said behavioral level description is within a Verilog compatible format.

44. The method of claim 37 wherein said reset signal is a synchronous reset signal.

45. The method of claim 37 wherein said reset signal is an asynchronous reset signal.

46. The method of claim 37 wherein said invalid state detection logic is isolated from said valid state operational logic such that said invalid state detection logic and said valid state operational logic do not overlap.

47. The method of claim 37 wherein said symbolic representation describes a state diagram.

48. The method of claim 37 wherein said automatic state machine extraction process further comprises a cutting algorithm.

49. A computer readable medium having stored thereon sequences of instructions which are executable by a digital processing system, and which, when executed by the digital processing system, cause the system to perform a method for designing a circuit, comprising:
   determining a state machine design point from a plurality of state machine design point options, a state machine design point option of said plurality of state machine design point options corresponding to a safe design point in which a state machine is designed to transition to a valid state if an invalid state is reached by said state machine;
   executing an automatic state machine extraction process in order to define a region of a logic design to be represented by a state machine circuit model;
   forming a symbolic representation of said state machine circuit model; and,
   compiling said symbolic representation into said state machine circuit model wherein said state machine circuit model conforms to said safe design point, if said safe design point is said determined state machine design point, such that said state machine circuit model has valid state operational logic that couples a first register input and output together through feedback, said first register having a reset input coupled to a reset circuit, said reset circuit including a reset shaping circuit that shapes a reset signal sent to said reset input, said reset circuit also including invalid state detection logic that recognizes if said first register reaches an invalid state and triggers said reset shaping circuit to issue said reset signal in response, said reset shaping circuit including a second register that helps shape said reset signal, said valid state logic at least partially separated from said invalid state logic.

50. The computer readable medium of claim 49 wherein said forming a symbolic representation of said state machine circuit model further comprises identifying invalid states of said state machine circuit model.

51. The computer readable medium of claim 49 wherein said forming a symbolic representation further comprises developing an expression that describes the operation of said state machine circuit model according to:

Next State=f[State Value, Inputs].

52. The computer readable medium of claim 49 wherein said compiling further comprises forming said safe state machine circuit model into an RTL compatible netlist.

53. The computer readable medium of claim 49 wherein said method further comprises incorporating said symbolic representation into a behavioral level description prior to said compiling.

54. The computer readable medium of claim 53 wherein said behavioral level description is within a VHDL compatible format.

55. The computer readable medium of claim 53 wherein said behavioral level description is within a Verilog compatible format.

56. The computer readable medium of claim 49 wherein said reset signal is a synchronous reset signal.

57. The computer readable medium of claim 49 wherein said reset signal is an asynchronous reset signal.

58. The computer readable medium of claim 49 wherein said invalid state detection logic is isolated from said valid state operational logic such that said invalid state detection logic and said valid state operational logic do not overlap.

59. The computer readable medium of claim 49 wherein said symbolic representation describes a state diagram.

60. The computer readable medium of claim 49 wherein said automatic state machine extraction process further comprises a cutting algorithm.

61. A method for designing a circuit, comprising:
forming a symbolic representation of a safe state machine circuit model if a safe design point is chosen as a design point for a state machine; and,
compiling said symbolic representation into said safe state machine circuit model, said safe state machine circuit model having valid state operational logic that couples a first register input and output together through feedback, said first register having a reset input coupled to a reset circuit, said reset circuit including a reset shaping circuit that shapes a reset signal sent to said reset input, said reset circuit also including invalid state detection logic that recognizes if said first register reaches an invalid state and triggers said reset shaping circuit to issue said reset signal in response, said reset shaping circuit including a second register that helps shape said reset signal, said valid state logic at least partially separated from said invalid state logic.

62. The method of claim 61 wherein said forming a symbolic representation of said state machine circuit model further comprises identifying invalid states of said state machine circuit model.

63. The method of claim 61 wherein said forming a symbolic representation further comprises developing an expression that describes the operation of said state machine circuit model according to:

Next State=f[State Value, Inputs].

64. The method of claim 61 wherein said compiling further comprises forming said safe state machine circuit model into an RTL compatible netlist.

65. The method of claim 61 further comprising incorporating said symbolic representation into a behavioral level description prior to said compiling.

66. The method of claim 65 wherein said behavioral level description is within a VHDL compatible format.

67. The method of claim 65 wherein said behavioral level description is within a Verilog compatible format.

68. The method of claim 61 wherein said reset signal is a synchronous reset signal.

69. The method of claim 61 wherein said reset signal is an asynchronous reset signal.

70. The method of claim 61 wherein said invalid state detection logic is isolated from said valid state operational logic such that said invalid state detection logic and said valid state operational logic do not overlap.

71. The method of claim 61 wherein said symbolic representation describes a state diagram.

72. A computer readable medium having stored thereon sequences of instructions which are executable by a digital processing system, and which, when executed by the digital processing system, cause the system to perform a method for designing a circuit, comprising:
forming a symbolic representation of a safe state machine circuit model if a safe design point is chosen as a design point for a state machine; and,
compiling said symbolic representation into said safe state machine circuit model, said safe state machine circuit model having valid state operational logic that couples a first register input and output together through feedback, said first register having a reset input coupled to a reset circuit, said reset circuit including a reset shaping circuit that shapes a reset signal sent to said reset input, said reset circuit also including invalid state detection logic that recognizes if said first register reaches an invalid state and triggers said reset shaping circuit to issue said reset signal in response, said reset shaping circuit including a second register that helps shape said reset signal, said valid state logic at least partially separated from said invalid state logic.

73. The computer readable medium of claim 72 wherein said forming a symbolic representation of said state machine circuit model further comprises identifying invalid states of said state machine circuit model.

74. The computer readable medium of claim 72 wherein said forming a symbolic representation further comprises developing an expression that describes the operation of said state machine circuit model according to:

Next State=f[State Value, Inputs].

75. The computer readable medium of claim 72 wherein said compiling further comprises forming said safe state machine circuit model into an RTL compatible netlist.

76. The computer readable medium of claim 72 further comprising incorporating said symbolic representation into a behavioral level description prior to said compiling.

77. The computer readable medium of claim 76 wherein said behavioral level description is within a VHDL compatible format.

78. The computer readable medium of claim 76 wherein said behavioral level description is within a Verilog compatible format.

79. The computer readable medium of claim 72 wherein said reset signal is a synchronous reset signal.

80. The computer readable medium of claim 72 wherein said reset signal is an asynchronous reset signal.

81. The computer readable medium of claim 72 wherein said invalid state detection logic is isolated from said valid state operational logic such that said invalid state detection logic and said valid state operational logic do not overlap.

82. The computer readable medium of claim 72 wherein said symbolic representation describes a state diagram.

83. A computer readable medium having stored thereon sequences of instructions which are executable by a digital processing system, and which, when executed by the digital processing system, cause the system to perform a method for designing a circuit comprising:

a) determining or allowing a designer to determine a state machine design point from a plurality of state machine design point options, a state machine design point of said plurality of state machine design point options corresponding to a safe design point; and, b) forming a safe state machine circuit model, if said safe design point is said determined state machine design point, said safe state machine circuit model having valid state logic separated from invalid state logic.

84. A computer readable medium having stored thereon sequences of instructions which are executable by a digital processing system, and which, when executed by the digital processing system, cause the system to perform a method for designing a circuit comprising:

determining or allowing a designer to determine a state machine design point from a plurality of state machine design point options, a state machine design point option of said plurality of state machine design point options corresponding to a safe design point in which a state machine is designed to transition to a valid state if an invalid state is reached by said state machine;

executing an automatic state machine extraction process in order to define a region of a logic design to be represented by a state machine circuit model;

forming a symbolic representation of said state machine circuit model; and, compiling said symbolic representation into said state machine circuit model wherein said state machine circuit model conforms to said safe design point, if said safe design point is said determined state machine design point, such that said state machine circuit model has valid state operational logic that couples a first register input and output together through feedback, said first register having a reset input coupled to a reset circuit, said reset circuit including a reset shaping circuit that shapes a reset signal sent to said reset input, said reset circuit also including invalid state detection logic that recognizes if said first register reaches an invalid state and triggers said reset shaping circuit to issue said reset signal in response, said reset shaping circuit including a second register that helps shape said reset signal, said valid state logic at least partially separated from said invalid state logic.

\* \* \* \* \*